United States Patent
Matsuda et al.

[11] Patent Number: 5,726,489
[45] Date of Patent: Mar. 10, 1998

[54] FILM CARRIER SEMICONDUCTOR DEVICE

[75] Inventors: Shuichi Matsuda; Keiichiro Kata, both of Tokyo, Japan

[73] Assignee: NEC Corporation, Tokyo, Japan

[21] Appl. No.: 531,271

[22] Filed: Sep. 20, 1995

[30] Foreign Application Priority Data

Sep. 30, 1994 [JP] Japan ................ 6-237854

[51] Int. Cl.⁶ ............................... H01L 23/48
[52] U.S. Cl. ................ 257/659; 257/692; 257/778
[58] Field of Search .................... 257/659, 207, 257/678, 692, 698, 723, 758, 778

[56] References Cited

U.S. PATENT DOCUMENTS

| 5,214,845 | 6/1993 | King et al. | |
| 5,357,400 | 10/1994 | Takekawa | 257/700 |
| 5,359,222 | 10/1994 | Okutomo et al. | 257/659 |
| 5,450,283 | 9/1995 | Lin et al. | 257/778 |

FOREIGN PATENT DOCUMENTS

| 0343400A2 | 11/1989 | European Pat. Off. |
| 0380906A2 | 8/1990 | European Pat. Off. |
| 0431205A1 | 6/1991 | European Pat. Off. |
| 0528684A2 | 2/1993 | European Pat. Off. |
| 4952973 | 5/1974 | Japan |
| 2186670 | 7/1990 | Japan |
| 5129366 | 5/1993 | Japan |
| 5152375 | 6/1993 | Japan |
| 669275 | 3/1994 | Japan |
| 677293 | 3/1994 | Japan |

OTHER PUBLICATIONS

European Search Report.

*Primary Examiner*—Tom Thomas
*Assistant Examiner*—Roy Potter
*Attorney, Agent, or Firm*—Whitham, Curtis, Whitham & McGinn

[57] ABSTRACT

A film carrier semiconductor device 10 comprises a semiconductor bare chip 20 and a carrier film 30. Chip electrodes 21 are provided on the bare chip 20. Each chip electrode 21 is electrically connected to the carrier film 30. Bump electrodes 37 are formed and arranged as an array on the carrier film 30 on the side of the other surface 31b of the film 30. Interconnection layers 32 are provided on the carrier film 30 to connect some of the chip electrodes 21b to the bump electrodes 37a and 37b. The semiconductor device 10 also comprises a noise blocking layer 60 provided on the carrier film 30 outside the chip mounting region. The noise blocking layer 60 is electrically connected to at least one of the chip electrodes 21a.

20 Claims, 4 Drawing Sheets

FILM CARRIER SEMICONDUCTOR DEVICE

BACKGROUND OF THE INVENTION

The present invention relates to a film carrier semiconductor device and, more particularly, to a film carrier semiconductor device which can advantageously be mounted on, for example, a circuit board at a high density.

Semiconductor packages of various forms have been developed to meet recent demands in the electronics field towards size and weight reduction, speed increase, and improvement of functional operations of the packages. The semiconductor device comprises a package and a semiconductor chip (hereinafter, also referred to as a chip) contained in the package.

The chip has been integrated higher and higher, and such a highly integrated semiconductor chip increases the number of pins thereon. In addition, there have been severe demands on the semiconductor chips towards the possible reduction in size. The pin-to-pin lead pitch should thus be reduced to meet these demands or requirements for the semiconductor devices. A semiconductor device having a high pin count can be obtained by inner lead bonding or by area array bonding. The inner lead bonding and the area array bonding are expected to be inevitable for the field of the semiconductors.

The inner lead bonding (ILB) is used to make electrical contact between the chip and the leads within the package. Various bonding technologies are available to achieve this inner lead bonding. Wire bonding is the most extensively used electrical interconnection process. In this process, fine wires are used to make electrical contact between the bonding pads on the chip and the corresponding leads on the package. The wire diameter is typically from 20 to 30 micrometers. Wire bonding techniques include thermocompression bonding, ultrasonic bonding, and thermosonic bonding.

The use of the fine wires limits the number of interconnections available in one package. The recent demands for the semiconductor devices with a high pin count thus causes a problem of poor connections between the wire and the bonding pads. Considering this fact, the wire bonding has been replaced with wireless bonding. The wireless bonding is also called gang bonding, with which all bumps on the electrode pads (hereinafter, also referred to as pads) are bonded simultaneously to the leads. Wireless bonding techniques include tape automated bonding (TAB) and flip-chip bonding. The TAB bonding is also referred to as tape carrier bonding.

In the TAB technique, a laminated tape of gold-plated copper foil etched in the form of leads is bonded to the bumps on the chip pads. The elimination of the wire bonding is advantageous from viewpoints of size reduction and highly integrated packaging of the device. On the other hand, the flip-chip bonding requires to make a raised metallic bump of solder on the chip. The chip is then inverted and bonded face down to the substrate interconnection pattern. This process lends itself to production of semiconductor devices with a high pin count and a smaller pitch. In addition, this technique is also advantageous to provide a fast, low-noise semiconductor device with the short length of the interconnections.

The TAB and flip-chip bonding techniques use the bumps provided between the chip and the film (package) to make electrical interconnection between them. These techniques are disclosed in, for example, Japanese Patent Laid-open Nos. 5-129366 and 6-77293.

As mentioned above, the film carrier semiconductor device disclosed in these laid-open publications uses the bumps for the electrical interconnection between the chip and the carrier film. There is another film carrier semiconductor device in which the electrical interconnection between the chip and the carrier film is achieved without using the bumps. The semiconductor chip and the carrier film are electrically connected during the assembly process. The bumps are used only for the purpose of connecting the film carrier semiconductor device with, for example, a circuit board. The film carrier semiconductor device of the type described comprises a semiconductor chip and a carrier film. Contact pads are provided on the semiconductor chip at one side thereof. The contact pads are arranged along the periphery of the semiconductor chip. Interconnecting layers are provided on the carrier film. The carrier film is also provided with through-holes and openings formed therein. The openings are formed at the position corresponding to the contact pads.

The bumps are formed on corresponding outer contact pads arranged as an array on the carrier film on the side facing to the substrate. The bumps are formed both within and outside the area corresponding to a chip mounting region. In this event, the bumps may be formed along the periphery of the chip and are connected to the chip electrodes through the interconnection layers. This structure causes a noise problem of the film carrier semiconductor device. More specifically, the bumps are arranged into an array and thus the bump located at or around the center of the array is connected to the corresponding chip electrode through a long interconnection layer. With a higher pin count, a longer interconnection layer may be required for the interconnection between the bump and the chip electrode. This raises the necessity to reduce the width of the wiring for a smaller semiconductor package. Such a long and thin wiring tends to be affected by noise from outside.

Some approaches have been made to reduce the effect of noise on the semiconductor device. An example is disclosed in Japanese Patent Laid-open No. 2-186670, in which a semiconductor IC comprises a conductive region for power supply provided on a package on which a semiconductor chip is mounted. The conductive region surrounds the semiconductor chip and is connected with power supply pads on the semiconductor chip. The technique disclosed in this laid-open publication is provided only for the purpose of reducing the number of outer pins for the power supply. The power supply pads on the semiconductor chip are connected with the conductive region through bonding wires. In other words, the semiconductor IC disclosed there is associated with the wire bonding process, which is outside the scope of the field to which the present invention relates.

Accordingly, an object of the present invention is to provide a film carrier semiconductor device which is less affected by noise, has good electrical properties, and can be meet a requirement, if any, for having a higher pin count.

SUMMARY OF THE INVENTION

In order to achieve the above mentioned object, there is provided with a film carrier semiconductor device comprising a semiconductor bare chip having chip electrodes on one surface thereof; a resin sealing the semiconductor bare chip; and a carrier film including a mounting region on a top surface, the semiconductor bare chip being adhered to said carrier film in said mounting region, the carrier film being provided with interconnections on said top surface connected to said chip electrodes, the film carrier semiconductor device further comprising a noise blocking layer provided on said top surface along the periphery thereof outside the chip mounting region so as to surround the interconnections, said resin sealing said noise blocking layer.

The above and other objects, features and advantages of the present invention will become more apparent in the following description and the accompanying drawing in which like reference numerals refer to like parts and components.

DESCRIPTION OF THE PREFERRED EMBODIMENT

Figure 1:
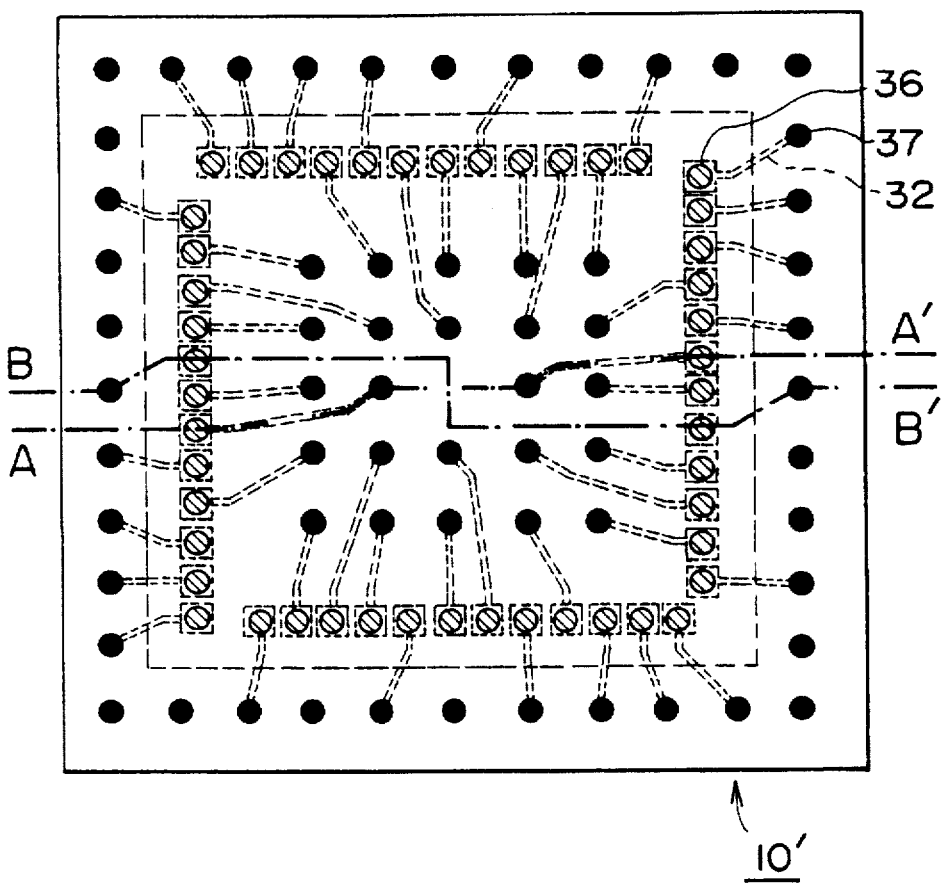
FIG. 1 is a plan view of a conventional film carrier semiconductor device.
Figure 2:
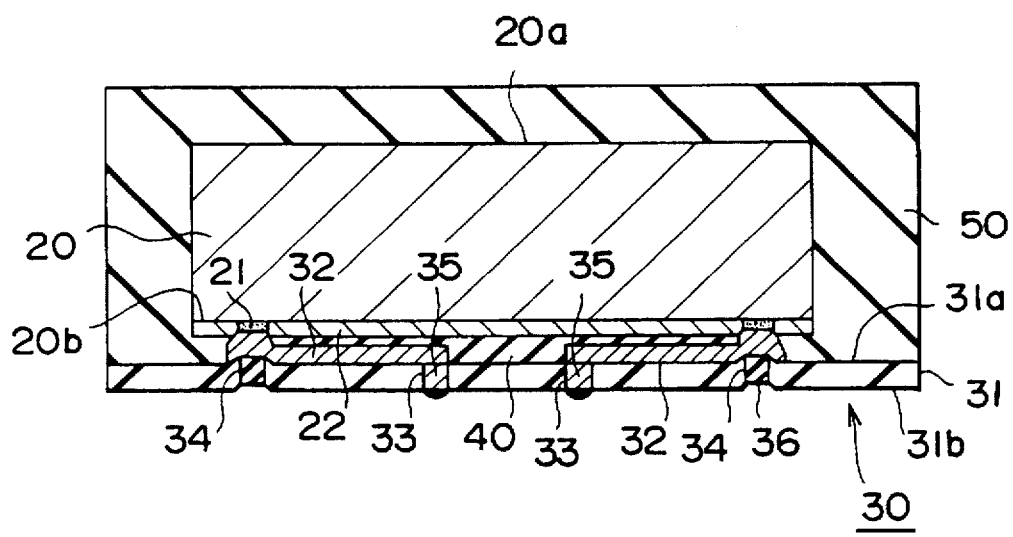
FIG. 2 is a cross-sectional view taken on line A–A' of FIG. 1.
Figure 3:
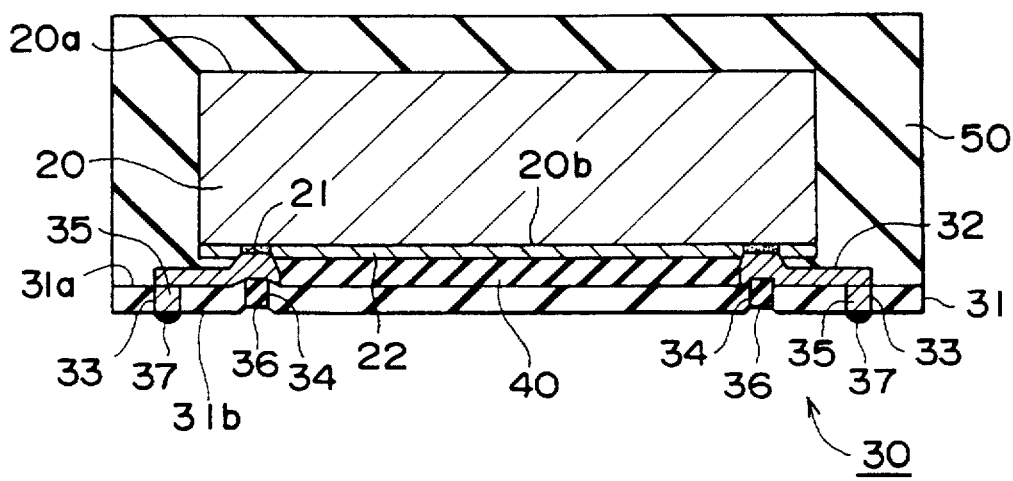
FIG. 3 is a cross-sectional view taken on line B–B' of FIG. 1.

A conventional film carrier semiconductor device is described first for the purpose of facilitating the understanding of the present invention. Referring to FIGS. 1 to 3, a film carrier semiconductor device 10' comprises a semiconductor bare chip 20 and a carrier film 30. An adhesion film 40 is interposed between the bare chip 20 and the carrier film 30. The adhesion film 40 is smaller than the semiconductor bare chip 20 and has a thickness of about several ten micrometers. The semiconductor bare chip 20 is prepared by using, for example, a well-known wafer manufacturing technique and has a first surface 20a and a second surface 20b. A plurality of contact pads (chip electrodes) 21 are provided on the bare chip 20 on the side of the second surface 20b. The contact pads 21 are arranged along the periphery of the bare chip 20 and each serves as an electrode for signals, for the power supply, or for the ground. The contact pads 21 may be, however, provided on the bare chip 20 within an active region. The contact pads 21 are typically made of an aluminum-based alloy. The bare chip 20 is also provided with a passivation film 22 formed on the second surface 20b thereof. The passivation film 22 may be made of, for example, polyimide, silicon nitride, or silicon oxide.

The carrier film 30 comprises an organic insulation film 31. The organic insulation film 31 may be, for example, a polyimide-based insulation film. The organic insulation film 31 has a first surface 31a and a second surface 31b. Interconnection layers 32 are provided on the organic insulation film 31 on the side of the first surface 31a. Through-holes 33 are formed in the insulation film 31. One end of each through-hole 33 faces the interconnection layer 32. Each through-hole 33 passes through the insulation film 31 to the second surface 31b thereof. The insulation film 31 is also provided with openings 34 penetrating through the film. The openings 34 are formed at the position corresponding to the contact pads 21. Each through-hole 33 is filled with a conductive electrode 35. Likewise, each opening 34 is filled with a filler material 36. The conductive electrode 35 contacts with one end of the interconnection layer 32. The other end of the interconnection layer 32 reaches between the contact pad 21 and the opening 34. The entire structure of the chip and the package is sealed with a resin 50.

Solder bumps (bump electrodes) 37 are formed on corresponding outer contact pads arranged as an array on the carrier film 30 at the second surface 31b thereof. The solder bumps 37 may be formed by using a method disclosed in, for example, Japanese Patent Laid-open No. 49-52973. The solder bumps 37 are formed by soldering a solder wire by using the wire bonding process on the surfaces of the semiconductor device corresponding to the pads on the chip. The balls are then bonded to the pads, following which the wires are cut. Some of the solder bumps 37 are formed within the area corresponding to a bare chip mounting region where the bare chip 20 is mounted. These solder bumps 37 are defined herein as a first group of the solder bumps. The remaining solder bumps 37 are formed outside the area corresponding to the bare chip mounting region. These bumps are defined herein as a second group of the solder bumps. If the bare chip mounting region is not enough for the bump electrodes, the bump electrodes 37 may be formed along the periphery of the chip as shown in FIG. 3. Considering the easy mounting of the semiconductor device on the circuit board or the like, the bump electrodes 37 may be arranged into an array at a pitch of 0.5 mm. As an example, the semiconductor chip mounting region has an area of 7 mm square available for forming the bump electrodes. Only two hundred and twenty-five pins, at maximum, can be formed within this region. To provide a region larger than the chip size for the bump formation, molding may advantageously be used. FIG. 1 shows the bump electrodes of which number is smaller by far than those formed in a practical process of manufacturing semiconductor devices. However, it can be understood by those skilled in the art that such few numbers of bump electrodes are merely for the purpose of simplifying the figure. It can also be understood that the number of the bumps and contact pads, as well as the pitch between them are not limited to the illustrated ones.

As mentioned above, the bump electrodes are arranged even along the periphery of the chip and are connected to the chip electrodes through the interconnection layer. This structure causes a noise problem of the film carrier semiconductor device 10'. The bump electrodes for mounting are arranged into an array. Accordingly, the bump electrode at or around the center of the array is connected to the corresponding chip electrode through a long interconnection layer. A longer interconnection layer may be required for the interconnection between the bump electrode and the chip electrode of the semiconductor device having a higher pin count. It is thus necessary to reduce the width of the wiring for a smaller semiconductor package. Such a long and thin wiring tends to be affected by noise from outside.

Figure 4:
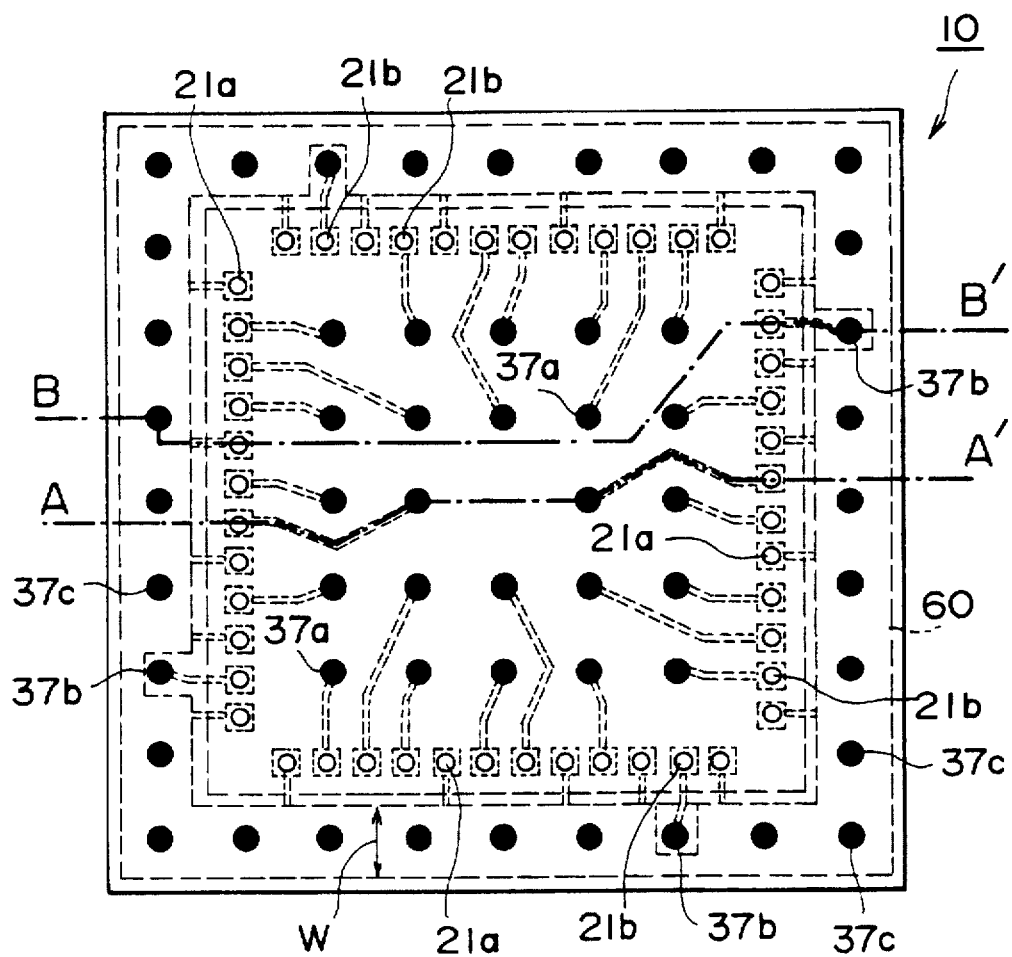
FIG. 4 is a plan view of a film carrier semiconductor device according to an embodiment of the present invention.
Figure 5:
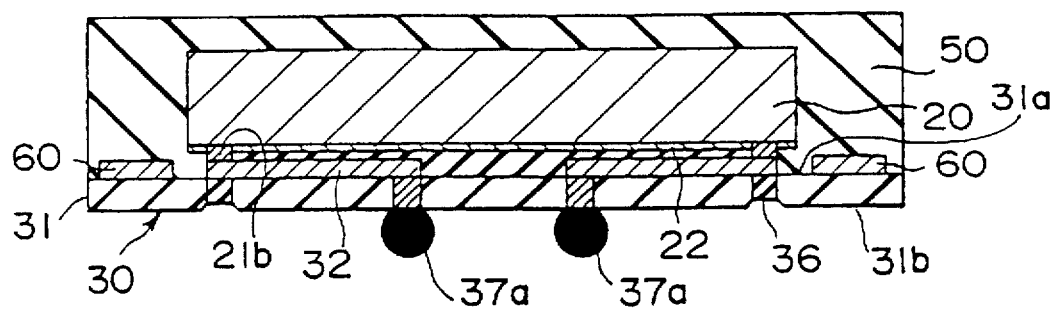
FIG. 5 is a cross-sectional view taken on line A–A' of FIG. 4.
Figure 6:
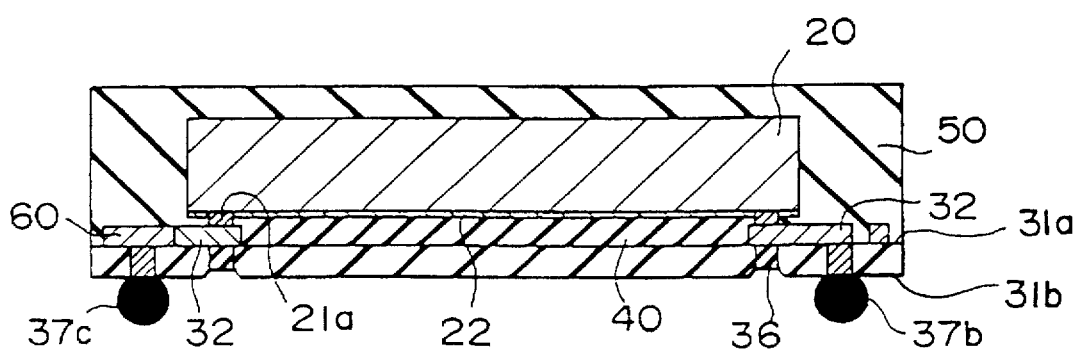
FIG. 6 is a cross-sectional view taken on line B–B' of FIG. 4.

An embodiment of the present invention is now described with reference to FIGS. 4 to 6. FIG. 4 is a plan view of a film carrier semiconductor device according to an embodiment of the present invention. FIG. 5 is a cross-sectional view taken on line A–A' of FIG. 4 while FIG. 6 is a cross-sectional view taken on line B–B' of FIG. 4. A noise blocking layer is a difference between a film carrier semiconductor device 10 and the film carrier semiconductor device 10'. More specifically, the film carrier semiconductor device 10 according to an embodiment of the present invention comprises the noise blocking layer 60 provided on the carrier film 30 along the periphery thereof on the side of the first surface 31a. The noise blocking layer 60 is outside the bare chip mounting region to form a closed loop. In other words, the noise blocking layer surrounds the interconnection layers 32 as shown in FIGS. 4 through 6. The chip electrodes 21 are located inside the closed loop of the noise blocking layer 60.

The noise blocking layer 60 is electrically connected to at least one chip electrode 21a. In this embodiment, twenty chip electrodes 21a are connected to the noise blocking layer 60. The remaining chip electrodes, which are depicted by 21b, are connected to the bump electrodes 37. It is noted that there is no limitation on the number of the chip electrodes 21 and 21b. The noise blocking layer 60 is either a power supply layer or a ground layer. More specifically, the noise blocking layer 60 serves as the power supply layer when it is electrically connected to the chip electrode(s) 21a used as the electrode(s) for the power supply. Likewise, the noise blocking layer 60 acts as the ground layer when it is connected to the chip electrode(s) 21a used as the electrode (s) for the ground.

In this embodiment, the bump electrodes 37 located within the noise blocking loop are all for transmitting signals (bump electrodes 37a). For the bump electrodes 37 located outside the chip mounting region, some are for transmitting signals and others not. The bump electrode 37b which is located outside the chip mounting region and is connected to the chip electrode 21b is used for the transmission of signals. In this event, the bump electrode 37b is not in contact with the noise blocking layer 60 as clearly shown in FIG. 6. It should be noted that the bump electrode 37b is not necessarily formed outside the chip mounting region. These bump electrodes 37b may be provided within the chip mounting region if this region has enough area for the bump electrodes 37a and 37b. The remaining bump electrodes 37c are either for grounding or for the power supply. More specifically, the bump electrodes 37c are used for grounding when the noise blocking layer 60 is the ground layer. Likewise, the bump electrodes 37c serve as the electrodes for the power supply when the noise blocking layer 60 is the power supply layer. The noise blocking layer 60 is made of a conductive material and is formed to have as large a width as possible in order to reduce the inductance thereof. In this event, the "width" of the noise blocking layer 60 means the distance in the direction depicted by W in FIG. 4.

As mentioned above, the demand for a larger number of bump electrodes 37 makes it necessary to use a longer interconnection layer 32. It is thus required to reduce the width of the interconnection layer in order to reduce the size of the semiconductor device. Such film carrier semiconductor device as illustrated in FIG. 1 is more likely to be affected by signal noise. On the contrary, the noise blocking layer 60 serves to reduce or even eliminate noise on the interconnection layers 32 after being connected with the chip electrodes.

While having thus been described in conjunction with an illustrative embodiment, the present invention is not limited to this embodiment. Instead, it is apparent from those skilled in the art that various changes, modifications, and alternations may be made on the above mentioned embodiment without departing from the scope and spirit of the present invention. For example, the noise blocking layer may be formed of two layers, i.e., the ground layer and the power supply layer rather than being formed as a single layer. In such a case, an insulation film or layer is interposed between the power supply layer and the ground layer.

What is claimed is:

1. A film carrier semiconductor device comprising:
   a semiconductor bare chip having chip electrodes on one surface thereof;
   a resin sealing said semiconductor bare chip;
   a carrier film including a mounting region on a top surface, said semiconductor bare chip being adhered to said carrier film in said mounting region, said carrier film being provided with interconnections in said mounting region on said top surface connected to said chip electrodes; and
   a noise blocking layer provided on said top surface along the periphery thereof outside the chip mounting region so as to surround the interconnections, said resin sealing said noise blocking layer.

2. A film carrier semiconductor device as claimed in claim 1, wherein said noise blocking layer comprises one of a power supply layer and a ground layer.

3. A film carrier semiconductor device as claimed in claim 1, wherein said noise blocking layer is formed of a power supply layer and a ground layer.

4. A film carrier semiconductor device as claimed in claim 1, wherein at least a portion of said noise blocking layer is electrically connected to a chip electrode.

5. A film carrier semiconductor device comprising:
   a semiconductor chip;
   a carrier film having first and second surfaces, the first surface facing to said semiconductor chip;
   bump electrodes provided on said carrier film on the second surface, a first group of bump electrodes being located within a second surface region corresponding to a chip mounting region where said semiconductor chip is mounted and a second group of said bump electrodes being located outside the second surface region;
   chip electrodes on said semiconductor chip and facing said carrier film, said chip electrodes each being located within the chip mounting region and electrically connected with said carrier film;
   interconnections for connecting said chip electrodes and said bump electrodes of the first group; and
   a noise blocking layer on said carrier film outside of the chip mounting region so as to surround the interconnections.

6. A film carrier semiconductor device as claimed in claim 5, wherein said noise blocking layer is made of a conductive material.

7. A film carrier semiconductor device as claimed in claim 6, wherein at least one of said chip electrodes is for use in supplying power to said device and said noise blocking layer serves as a power supply layer.

8. A film carrier semiconductor device as claimed in claim 5, wherein said noise blocking layer is electrically connected to at least one of said chip electrodes.

9. A film carrier semiconductor device as claimed in claim 6, wherein at least one of said chip electrodes is for use in grounding said device and said noise blocking layer serves as a ground layer.

10. A film carrier semiconductor device as claimed in claim 6, wherein said noise blocking layer is formed of two layers between which an insulation film is interposed.

11. A film carrier semiconductor device as claimed in claim 10, wherein one of the two layers is a power supply layer and the other is a ground layer, the power supply layer being electrically connected to said chip electrodes that are for use in supplying power to said device while the ground layer being electrically connected to said chip electrodes that are for grounding said device.

12. A film carrier semiconductor device as claimed in claim 5, wherein said semiconductor chip mounted on said carrier film is sealed with resin.

13. A film carrier semiconductor device as claimed in claim 5, wherein said semiconductor chip mounted on said carrier film and said noise blocking layer are sealed with resin.

14. A film carrier semiconductor device comprising:

a semiconductor chip;

a carrier film having first and second surfaces, the first surface facing said semiconductor chip, said carrier film being larger in length and width than said semiconductor chip;

bump electrodes provided on said carrier film on the second surface, a first group of bump electrodes being located within a second surface region corresponding to a chip mounting region where said semiconductor chip is mounted and a second group of said bump electrodes being located outside the second surface region;

chip electrodes on said semiconductor chip and facing said carrier film, said chip electrodes each being located within the chip mounting region and electrically connected with said carrier film;

interconnections for connecting said chip electrodes and said bump electrodes of the first group; and a noise blocking layer on said first surface and outside of the chip mounting region so as to surround the interconnections.

15. A film carrier semiconductor device as claimed in claim 14, wherein said noise blocking layer is made of a conductive material.

16. A film carrier semiconductor device as claimed in claim 15, wherein said noise blocking layer is electrically connected to at least one of said chip electrodes.

17. A film carrier semiconductor device as claimed in claim 15, wherein at least one of said chip electrodes is for use in supplying power to said device and said noise blocking layer serves as a power supply layer.

18. A film carrier semiconductor device as claimed in claim 15, wherein at least one of said chip electrodes is for use in grounding said device and said noise blocking layer serves as a ground layer.

19. A film carrier semiconductor device as claimed in claim 15, wherein said noise blocking layer is formed of two layers between which an insulation film is interposed.

20. A film carrier semiconductor device as claimed in claim 19, wherein one of the two layers is a power supply layer and the other is a ground layer, the power supply layer being electrically connected to said chip electrodes that are for use in supplying power to said device while the ground layer being electrically connected to said chip electrodes that are for grounding said device.

* * * * *